United States Patent
Wakata et al.

(10) Patent No.: US 10,958,232 B2
(45) Date of Patent: Mar. 23, 2021

(54) LC FILTER

(71) Applicant: TDK Corporation, Tokyo (JP)

(72) Inventors: Eiko Wakata, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/521,039

(22) Filed: Jul. 24, 2019

(65) Prior Publication Data

US 2020/0035410 A1 Jan. 30, 2020

(30) Foreign Application Priority Data

Jul. 30, 2018 (JP) .............................. JP2018-142545

(51) Int. Cl.
| | |
|---|---|
| *H03H 7/01* | (2006.01) |
| *H01G 4/40* | (2006.01) |
| *H01F 27/40* | (2006.01) |
| *H01G 4/012* | (2006.01) |
| *H01F 27/28* | (2006.01) |
| *H01F 27/29* | (2006.01) |
| *H01G 4/228* | (2006.01) |
| *H01G 4/06* | (2006.01) |
| *H03H 1/00* | (2006.01) |

(52) U.S. Cl.
CPC ....... *H03H 7/0115* (2013.01); *H01F 27/2804* (2013.01); *H01F 27/29* (2013.01); *H01F 27/40* (2013.01); *H01G 4/012* (2013.01); *H01G 4/06* (2013.01); *H01G 4/228* (2013.01); *H01G 4/40* (2013.01); *H03H 2001/0085* (2013.01)

(58) Field of Classification Search
CPC . H03H 2001/0085; H03H 7/0115; H01G 4/40
USPC .................................................. 333/175, 185
See application file for complete search history.

(56) References Cited

U.S. PATENT DOCUMENTS

| | | | |
|---|---|---|---|
| 2002/0093397 A1* | 7/2002 | Nosaka | H03H 7/1725 333/185 |
| 2010/0259344 A1* | 10/2010 | Nosaka | H03H 7/1783 333/219.1 |
| 2018/0316331 A1 | 11/2018 | Nakaiso | |
| 2019/0280667 A1* | 9/2019 | Oide | H03H 7/0115 |

FOREIGN PATENT DOCUMENTS

WO 2018/030134 A1 2/2018

* cited by examiner

*Primary Examiner* — Rakesh B Patel
(74) *Attorney, Agent, or Firm* — McDermott Will & Emery LLP

(57) ABSTRACT

Disclosed herein is an LC filter that includes a conductive substrate, a first capacitive insulating film having one surface covered with the conductive substrate and other surface covered with a first capacitive electrode, a first inductor pattern having one end connected to the first capacitive electrode, a first terminal electrode connected to other end of the first inductor pattern, and a common terminal electrode connected to the conductive substrate.

8 Claims, 7 Drawing Sheets

LC FILTER

BACKGROUND OF THE INVENTION

Field of the Invention

The present invention relates to an LC filter and, more particularly, to a chip-type LC filter.

Description of Related Art

As a chip-type LC filter, the LC filter described in WO 2018/030134 is known. The LC filter described in WO 2018/030134 has a configuration in which a capacitance part and a coil part are formed on a resin sheet. The capacitance part is constituted of a capacitive insulating film formed on the resin sheet and two capacitive electrodes formed on one surface of the capacitive insulating film.

However, since the two capacitive electrodes are formed on one surface of the capacitive insulating film in the LC filter described in WO 2018/030134, it is difficult to obtain a large capacitance. In order to obtain a larger capacitance, the two capacitive electrodes may be formed so as to vertically sandwich the capacitive insulating film; in this case, however, the number of conductive layers is increased, so that the thickness of the entire LC filter is disadvantageously increased.

SUMMARY

It is therefore an object of the present invention to provide an LC filter capable of reducing the height thereof while ensuring a sufficient capacitance.

An LC filter according to the present invention includes: a conductive substrate; a first capacitive insulating film having one surface covered with the conductive substrate and the other surface covered with a first capacitive electrode; a first inductor pattern having one end connected to the first capacitive electrode; a first terminal electrode connected to the other end of the first inductor pattern; and a common terminal electrode connected to the conductive substrate.

According to the present invention, by using the conductive substrate as a capacitive electrode, there is obtained a configuration in which the capacitive insulating film is vertically sandwiched by two capacitive electrodes. Thus, it is possible to ensure a sufficient capacitance without involving increase in the number of conductive layers.

The LC filter according to the present invention may further include a second terminal electrode connected to the first capacitive electrode and one end of the first inductor pattern and a second capacitive insulating film having one surface covered with the conductive substrate and the other surface covered with a second capacitive electrode, and the first terminal electrode may be connected to the second capacitive electrode. Thus, it is possible to constitute a so-called π-type LC filter by connecting the common terminal electrode to a ground potential.

In this case, the LC filter may further include: a third capacitive insulating film having one surface covered with the conductive substrate and the other surface covered with a third capacitive electrode; a fourth capacitive insulating film having one surface covered with the conductive substrate and the other surface covered with a fourth capacitive electrode; a second inductor pattern having one end connected to the third capacitive electrode and the other end connected to the fourth capacitive electrode; a third terminal electrode connected to the third capacitive electrode and one end of the second inductor pattern; a fourth terminal electrode connected to the fourth capacitive electrode and the other end of the second inductor pattern, and the pattern shape of the first inductor pattern and that of the second inductor pattern may be symmetric. Thus, when current is made to flow from the second terminal electrode to the first terminal electrode and from the third terminal electrode to the fourth terminal electrode, the current flows in the same direction in the adjacent wires of the first and second inductor patterns, thereby allowing a larger attenuation to be obtained.

The LC filter according to the present invention may further include a second inductor pattern having one end connected to the first capacitive electrode and one end of the first inductor pattern and a second terminal electrode connected to the other end of the second inductor pattern. Thus, it is possible to constitute a so-called T-type LC filter by connecting the common terminal electrode to a ground potential.

In this case, the LC filter may further include: a second capacitive insulating film having one surface covered with the conductive substrate and the other surface covered with the second capacitive electrode; third and fourth terminal electrodes; a third inductor pattern having one end connected to the second capacitive electrode and the other end connected to the third terminal electrode; and a fourth inductor pattern having one end connected to the second capacitive electrode and the other end connected to the fourth terminal electrode, and the pattern shape of the first and second inductor patterns and the pattern shape of the third and fourth inductor patterns may be symmetric. Thus, when current is made to flow from the first terminal electrode to the second terminal electrode and from the third terminal electrode to the fourth terminal electrode, the current flows in the same direction in the adjacent wires of the first and third inductor patterns, and the current flows in the same direction in the adjacent wires of the second and fourth inductor patterns, thereby allowing a larger attenuation to be obtained.

In the present invention, the conductive substrate may include one metal element selected from a group consisting of Ni, Cu, W, Pt, and Au. This allows high conductivity to be ensured and allows a ceramic material to be used as the capacitive insulating film.

In the present invention, the first inductor pattern may include a conductor pattern wound in a coil shape. This allows a high inductance to be obtained.

Thus, according to the present invention, there can be provided an LC filter having a sufficient capacitance and low height.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
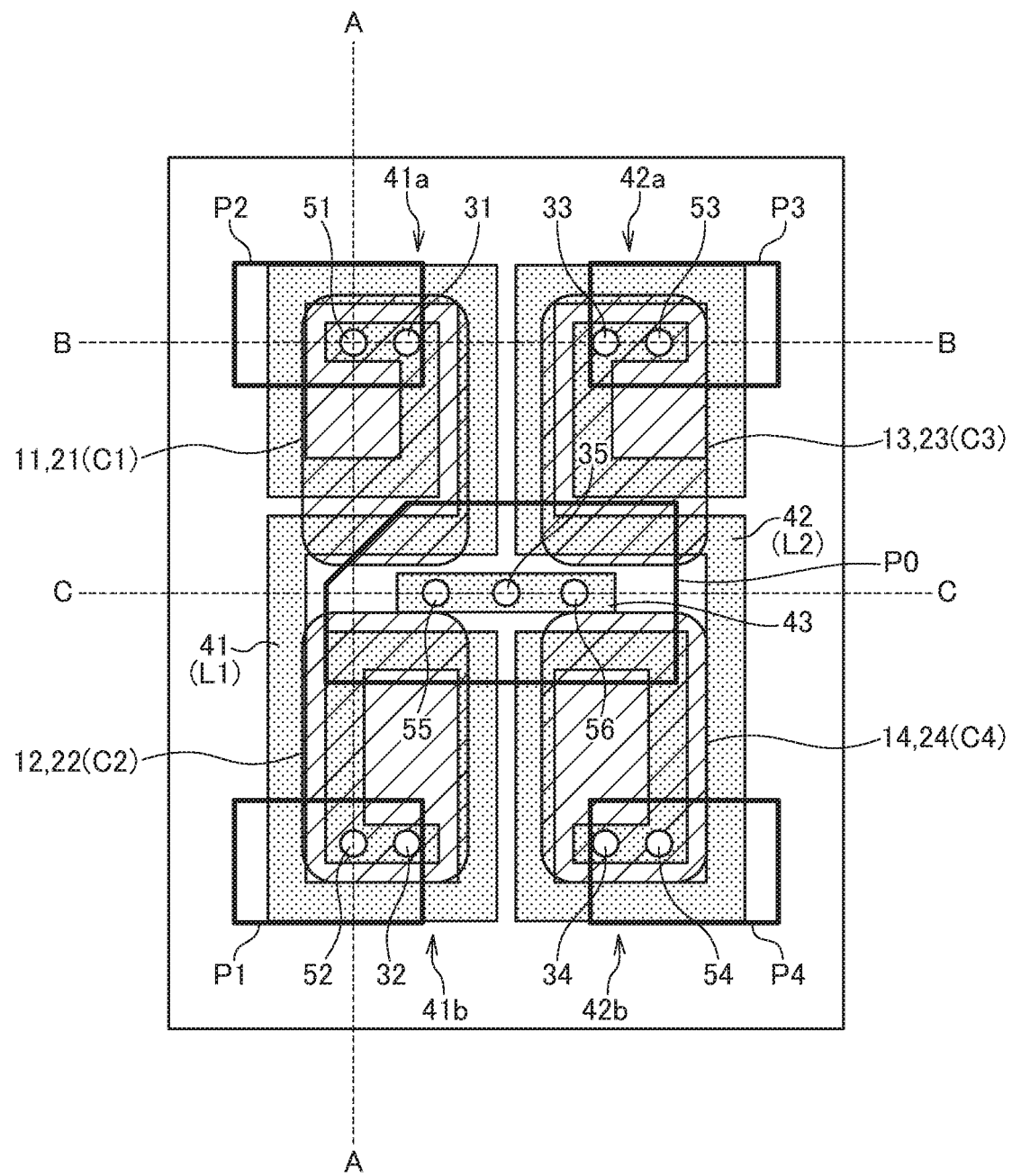
FIG. 1 is a transparent plan view for explaining the configuration of an LC filter according to a first embodiment of the present invention.
Figure 2:
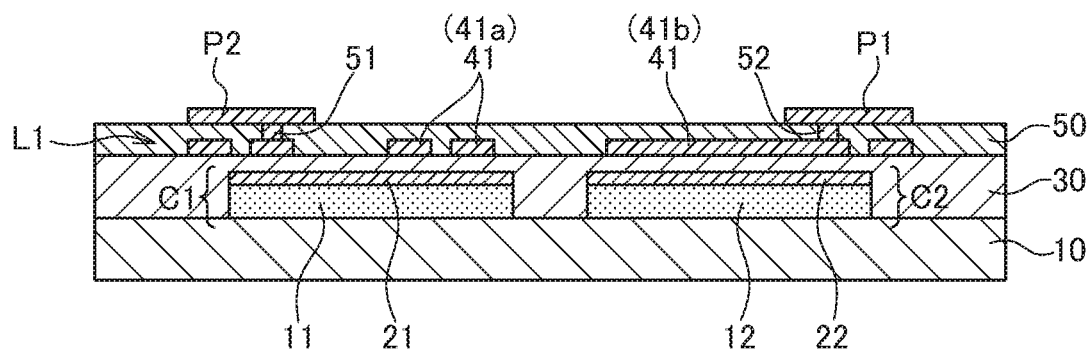
FIG. 2 is a cross-sectional view taken along line A-A in FIG. 1.
Figure 3:
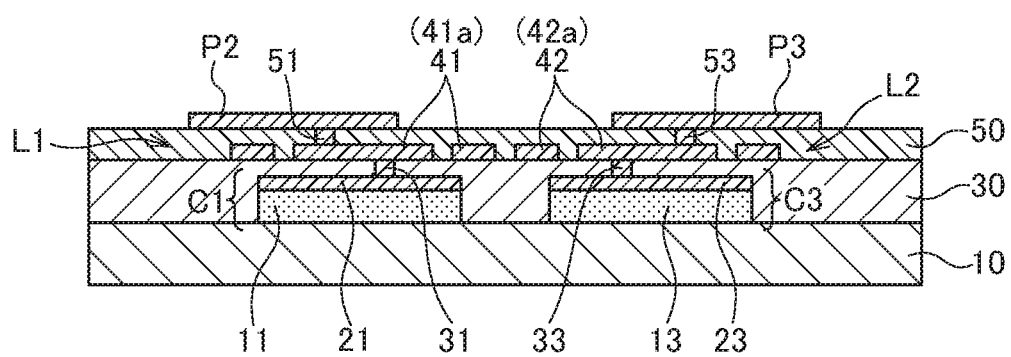
FIG. 3 is a cross-sectional view taken along line B-B in FIG. 1.
Figure 4:
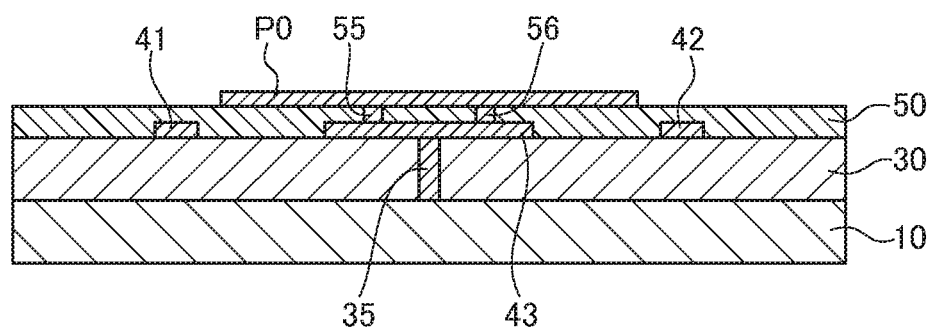
FIG. 4 is a cross-sectional view taken along line C-C in FIG. 1.

FIG. 1 is a transparent plan view for explaining the configuration of an LC filter according to the first embodiment of the present invention. FIG. 2 is a cross-sectional view taken along line A-A in FIG. 1, FIG. 3 is a cross-sectional view taken along line B-B in FIG. 1, and FIG. 4 is a cross-sectional view taken along line C-C in FIG. 1.

As illustrated in FIGS. 1 to 4, the LC filter according to the present embodiment includes a conductive substrate 10 and capacitors C1 to C4 and inductors L1, L2 which are formed on the conductive substrate 10. The conductive substrate 10 is made of a metal material such as Ni, Cu, W, Pt, or Au. Among them, Ni is particularly preferably used, considering conductively, heat resistivity, and cost.

Four capacitive insulating films 11 to 14 and capacitive electrodes 21 to 24 covering the capacitive insulating films 11 to 14, respectively, are formed on the surface of the conductive substrate 10. As the capacitive insulating films 11 to 14, a ceramic material having a perovskite structure, such as barium titanate, is preferably used. Although not particularly limited, in the present embodiment, the capacitive insulating films 11 to 14 are directly formed on the surface of the conductive substrate 10. As a result, four capacitors C1 to C4 each having the conductive substrate 10 as a lower electrode and capacitive electrodes 21 to 24 as upper electrodes are formed. The capacitance of each of the capacitors C1 to C4 can be adjusted by the area or thickness of each of the capacitive insulating films 11 to 14. Further, the capacitors C1 to C4 each have a structure in which the capacitive insulating film (11, 12, 13, 14) is vertically sandwiched by the conductive substrate 10 and capacitive electrode (21, 22, 23, 24), so that a large capacitance can be obtained with a small planar size.

The capacitive insulating films 11 to 14 and capacitive electrodes 21 to 24 are covered with an insulating layer 30 made of resin or the like. Inductor patterns 41, 42 and a connection pattern 43 are formed on the surface of the insulating layer 30. The inductor pattern 41 includes a spiral part 41a wound in the clockwise direction from the inner peripheral end to the outer peripheral end thereof and a spiral part 41b wound in the clockwise direction from the inner peripheral end to the outer peripheral end thereof, and the outer peripheral ends of the spiral parts 41a and 41b are connected to each other. Thus, when current is made to flow in the inductor pattern 41, the current flows in the same direction in the adjacent wires. Similarly, the inductor pattern 42 includes a spiral part 42a wound in the counter-clockwise direction from the inner peripheral end to the outer peripheral end thereof and a spiral part 42b wound in the counterclockwise direction from the inner peripheral end to the outer peripheral end thereof, and the outer peripheral ends of the spiral parts 42a and 42b are connected to each other. Thus, when current is made to flow in the inductor pattern 42, the current flows in the same direction in the adjacent wires. Further, in the present embodiment, the pattern shape of the inductor pattern 41 and that of the inductor pattern 42 are symmetric.

The inner peripheral end of the spiral part 41a is connected to the capacitive electrode 21 through a via conductor 31, the inner peripheral end of the spiral part 41b is connected to the capacitive electrode 22 through a via conductor 32, the inner peripheral end of the spiral part 42a is connected to the capacitive electrode 23 through a via conductor 33, and the inner peripheral end of the spiral part 42b is connected to the capacitive electrode 24 through a via conductor 34. The connection pattern 43 is disposed substantially at the center of the LC filter in a plan view and is connected to the conductive substrate 10 through a via conductor 35.

The inductor patterns 41, 42, and connection pattern 43 are covered with an insulating layer 50 made of resin or the like. Terminal electrodes P1 to P4 and a common terminal electrode P0 are formed on the surface of the insulating layer 50. The terminal electrode P2 is connected to the inner peripheral end of the spiral part 41a through a via conductor 51, the terminal electrode P1 is connected to the inner peripheral end of the spiral part 41b through a via conductor 52, the terminal electrode P3 is connected to the inner peripheral end of the spiral part 42a through a via conductor 53, the terminal electrode P4 is connected to the inner peripheral end of the spiral part 42b through a via conductor 54, and the common terminal electrode P0 is connected to the connection pattern 43 through via conductors 55 and 56.

Figure 5:
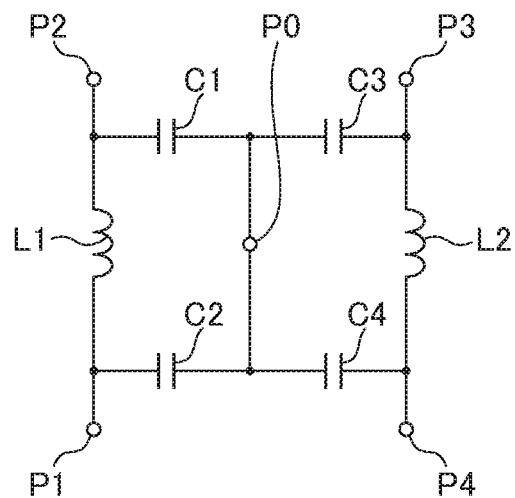
FIG. 5 is an equivalent circuit diagram of the LC filter according to the first embodiment of the present invention.

FIG. 5 is an equivalent circuit diagram of the LC filter according to the present embodiment.

As illustrated in FIG. 5, the LC filter according to the present embodiment has a circuit configuration in which the inductor L1 is connected between the terminal electrodes P1 and P2, the inductor L2 is connected between the terminal electrodes P3 and P4, and the capacitors C1 to C4 are connected between the terminal electrodes P1 to P4 and common terminal electrode P0, respectively. In actual use, the common terminal electrode P0 is connected to a ground potential. With this configuration, the inductor L1 and capacitors C1 and C2 constitute a first π-type LC filter, in which the terminal electrodes P2 and P1 are used as a signal input terminal and a signal output terminal, respectively. Further, the inductor L2 and capacitors C3 and C4 constitute a second π-type LC filter, in which the terminal electrodes P3 and P4 are used as a signal input terminal and a signal output terminal, respectively. The π-type LC filter has a capacitive impedance and is low in impedance in a high frequency band.

Figure 6:
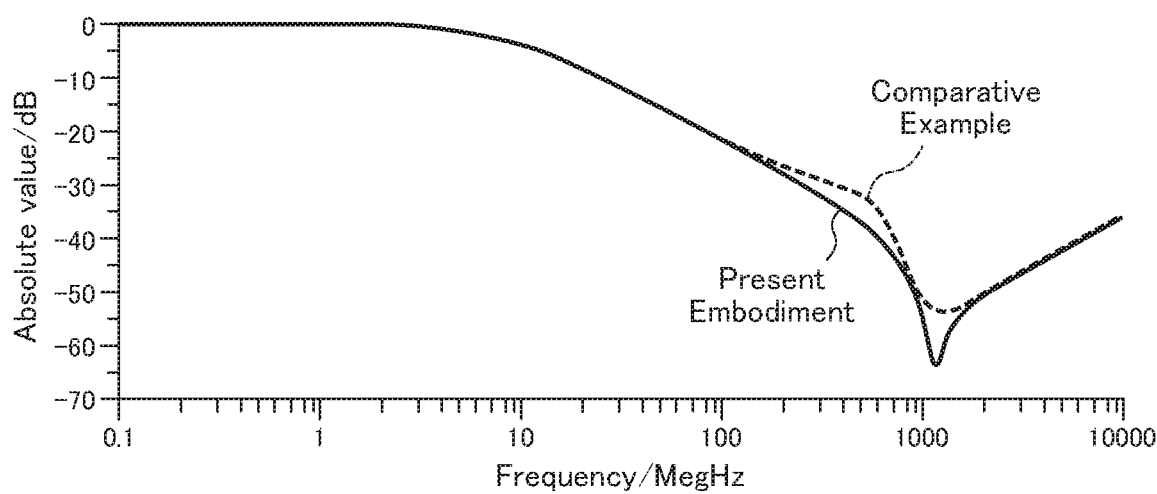
FIG. 6 is a graph illustrating the passage characteristics of the LC filter according to the first embodiment of the present invention.

FIG. 6 is a graph illustrating the passage characteristics of the LC filter according to the present embodiment in a case where Ni is used as the conductive substrate 10. FIG. 6 further illustrates a comparative example of the passage characteristics. In the comparative example, an insulating substrate is used in place of the conductive substrate 10, and a lower electrode is additionally formed between the insulating substrate and the capacitive insulating films 11 to 14 and is connected to the common terminal electrode P0.

As illustrated in FIG. 6, the LC filter according to the present embodiment exhibits a larger attenuation in a resonance frequency band (about 1 GHz) than the LC filter of the comparative example. The frequency band in which an attenuation of −35 dB can be obtained is 700 MHz to 10 GHz in the LC filter of the comparative example, whereas 400 MHz to 10 GHz in the LC filter according to the present embodiment. Thus, the attenuation band is widened in the present embodiment. The reason that such an effect can be obtained is that using the Ni substrate increases impedance in a frequency region lower than the resonance frequency and increases reflection in a frequency region higher than the resonance frequency.

As described above, the LC filter according to the present embodiment uses the conductive substrate 10 as the lower electrode for the capacitors C1 to C4, so that it is possible to ensure a sufficient capacitance without involving increase in the number of conductive layers. In addition, as compared to a general LC filter using an insulating substrate, a wider attenuation band can be obtained. As a result, it is possible to provide an LC filter high in performance and low in height.

Further, in the present embodiment, the pattern shape of the inductor pattern 41 and that of the inductor pattern 42 are symmetric, so that when current is made to flow from the terminal electrode P2 to the terminal electrode P1 and from the terminal electrode P3 to the terminal electrode P4, the current flows in the same direction in the adjacent wires of the inductor patterns 41 and 42. Thus, electromagnetic field coupling is achieved in a direction that strengthens a magnetic field, whereby inductance is increased, and impedance is increased in a high frequency band. As a result, a larger attenuation can be obtained.

The following describes a manufacturing method for the LC filter according to the present embodiment.

Figure 7:
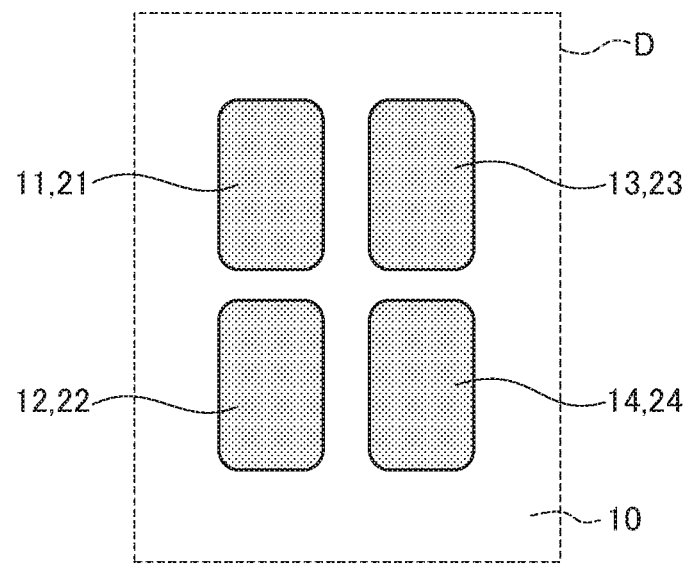
FIGS. 7 to 10 are process views for explaining a method of manufacturing the LC filter according to the first embodiment of the present invention.
Figure 8:
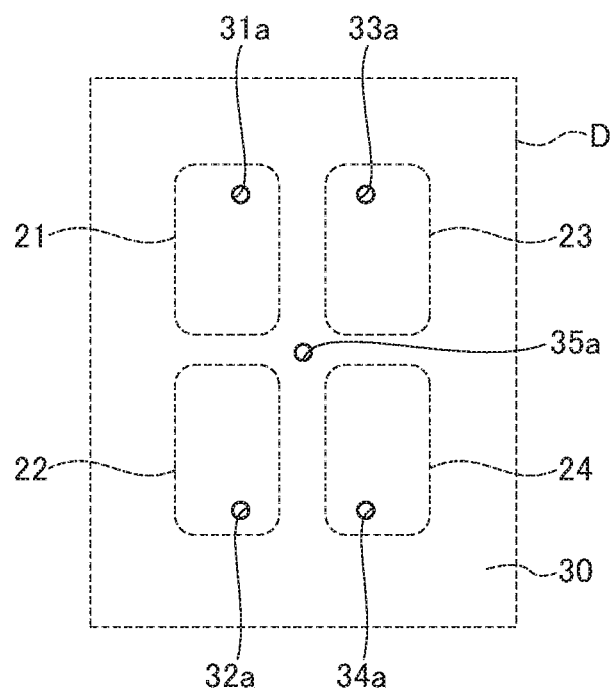
Figure 9:
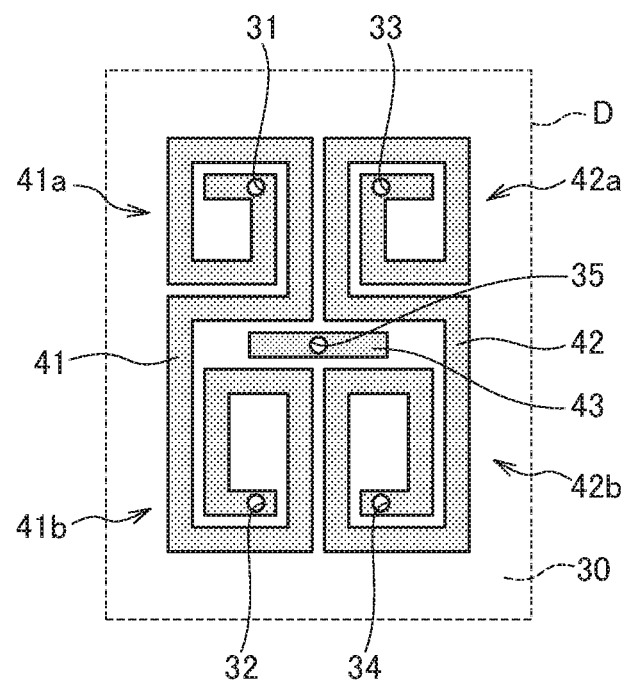

FIGS. 7 to 10 are process views for explaining the LC filter manufacturing method according to the present embodiment. Although not particularly limited, the LC filters according to the present embodiment are not individually formed, but may be collectively formed using an aggregate substrate from which a plurality of filters can be obtained. The area surrounded by the dashed line D in FIGS. 7 to 9 is a part corresponding to one LC filter obtained as the final product.

First, as illustrated in FIG. 7, the capacitive insulating films 11 to 14 and capacitive electrodes 21 to 24 are formed on the surface of the conductive substrate 10 which is an aggregate substrate. Then, as illustrated in FIG. 8, the insulating layer 30 covering the capacitive insulating films 11 to 14 and capacitive electrodes 21 to 24 is formed and, thereafter, vias 31a to 34a partially exposing therethrough the respective capacitive electrodes 21 to 24 and a via 35a partially exposing therethrough the conductive substrate 10 are formed in the insulating layer 30.

In this state, as illustrated in FIG. 9, the inductor patterns 41, 42 and connection pattern 43 are formed on the surface of the insulating layer 30. Thus, the via conductors 31 to 35 are formed in the respective vias 31a to 35a, with the result that one end of the inductor pattern 41 is connected to the capacitive electrode 21 through the via conductor 31, the other end of the inductor pattern 41 is connected to the capacitive electrode 22 through the via conductor 32, one end of the inductor pattern 42 is connected to the capacitive electrode 23 through the via conductor 33, and the other end of the inductor pattern 42 is connected to the capacitive electrode 24 through the via conductor 34. Further, the connection pattern 43 is connected to the conductive substrate 10 through the via conductor 35.

Figure 10:
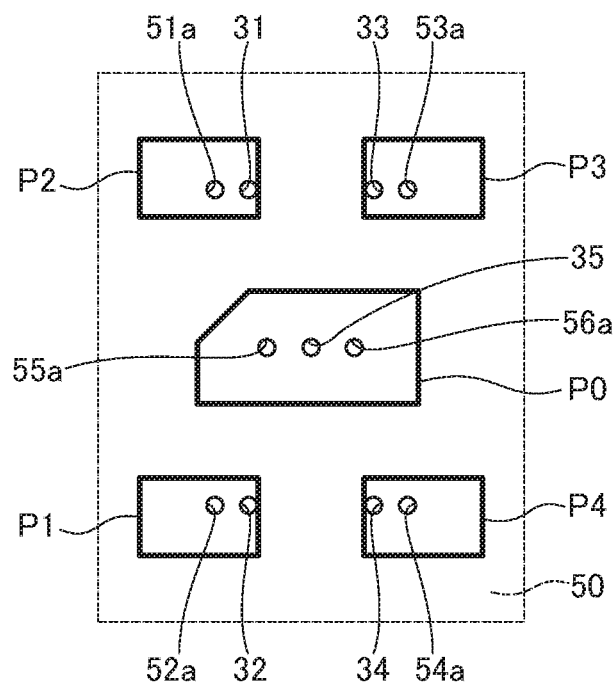

Then, as illustrated in FIG. 10, the insulating layer 50 covering the inductor patterns 41, 42 and the connection pattern and, thereafter, vias 51a and 52a partially exposing therethrough the inductor pattern 41 and vias 53a and 54a partially exposing therethrough the inductor pattern 42, and vias 55a and 56a partially exposing therethrough the connection pattern 43 are formed in the insulating layer 50. In this state, the terminal electrodes P1 to P4 and common terminal electrode P0 are formed, whereby via conductors 51 to 56 are formed in the respective vias 51a to 56a. Thereafter, when the individualization is performed along the dashed line D, the LC filter according to the present embodiment is completed.

As described above, in the present embodiment, it is possible to form an LC filter using three conductive layers.

Figure 11:
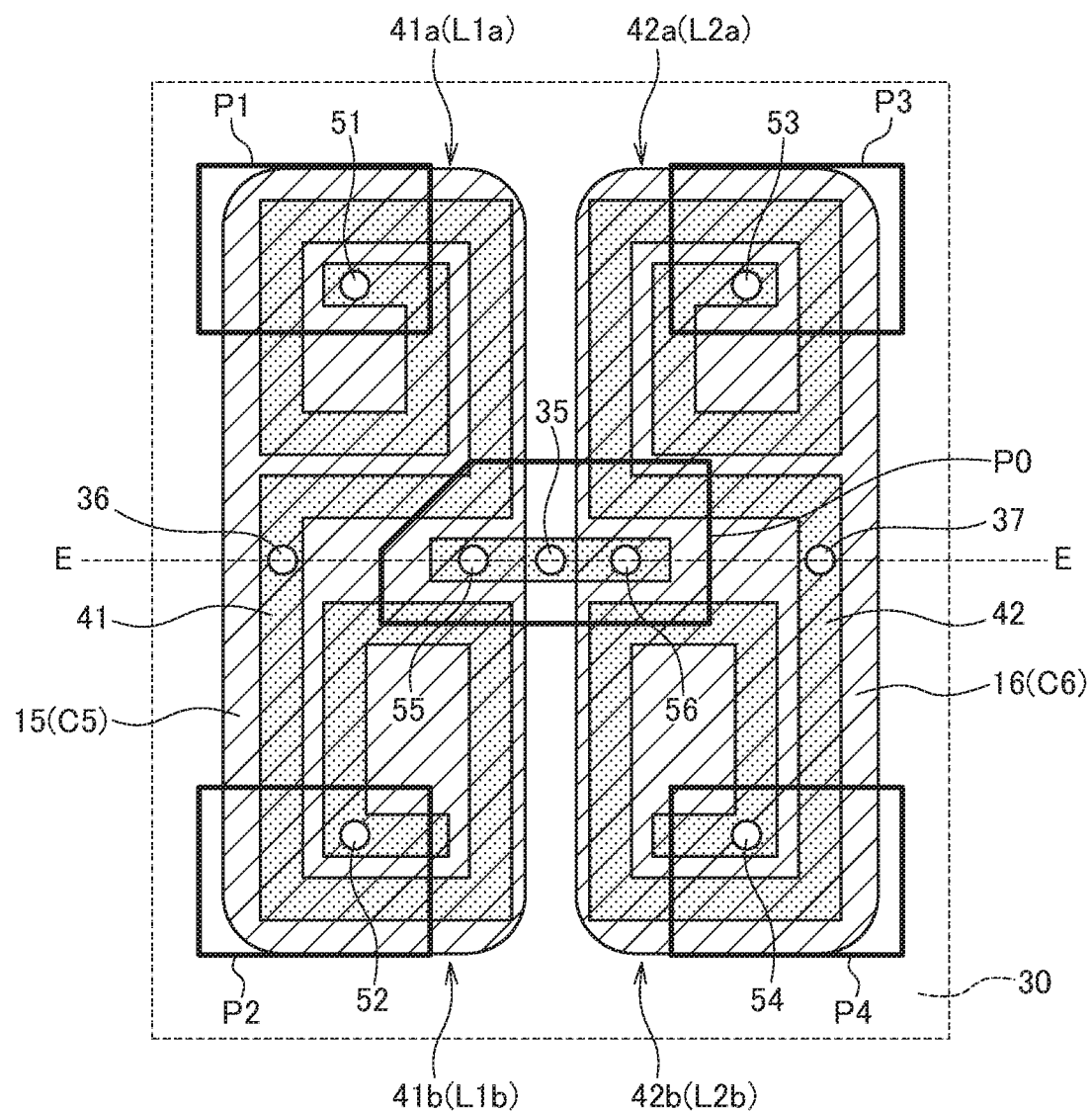
FIG. 11 is a transparent plan view for explaining the configuration of an LC filter according to a second embodiment of the present invention.
Figure 12:
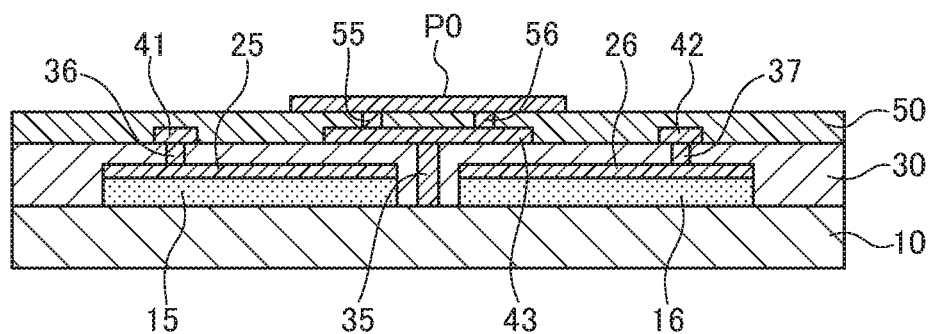
FIG. 12 is a cross-sectional view taken along line E-E in FIG. 11.

FIG. 11 is a transparent plan view for explaining the configuration of an LC filter according to the second embodiment of the present invention. FIG. 12 is a cross-sectional view taken along line E-E in FIG. 11.

As illustrated in FIGS. 11 and 12, the LC filter according to the second embodiment differs from the LC filter according to the first embodiment in that capacitive insulating films 15 and 16 are used in place of the capacitive insulating films 11 to 14, that capacitive electrodes 25 and 26 are used in place of the capacitive electrodes 21 to 24, and that via conductors 36 and 37 are used in place of the via conductors 31 to 34. Other basic configurations are the same as those of the LC filter according to the first embodiment, so the same reference numerals are given to the same elements, and overlapping description will be omitted.

The capacitive insulating film 15 and capacitive electrode 25 are covered with the inductor pattern 41, and the capacitive insulating layer 16 and capacitive electrode 26 are covered with the inductor pattern 42. As a result, two capacitors C5 and C6 each having the conductive substrate 10 as a lower electrode and having capacitive electrodes 25 and 26 as upper electrodes are formed.

The via conductor 36 connects substantially the middle point of the inductor pattern 41, i.e., the connection point between the spiral part 41a and the spiral part 41b and the capacitive electrode 25. Similarly, the via conductor 37 connects substantially the middle point of the inductor pattern 42, i.e., the connection point between the spiral part 42a and the spiral part 42b and the capacitive electrode 26. In the present embodiment, the spiral parts 41a and 41b constitute inductors L1a and L1b, respectively, and the spiral parts 42a and 42b constitute inductors L2a and L2b, respectively.

Figure 13:
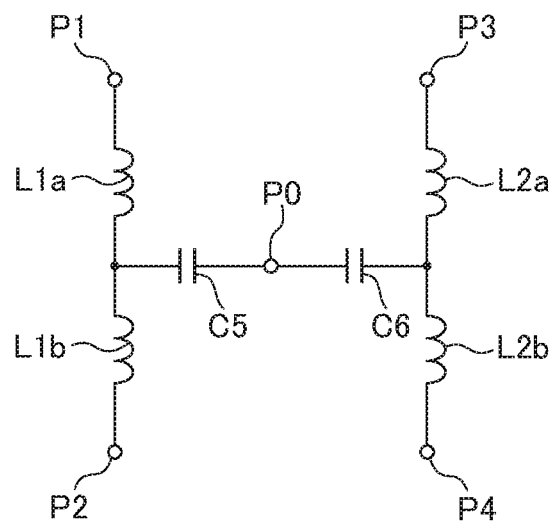
FIG. 13 is an equivalent circuit diagram of the LC filter according to the second embodiment of the present invention.

FIG. 13 is an equivalent circuit diagram of the LC filter according to the second embodiment.

As illustrated in FIG. 13, in the LC filter according to the present embodiment, the inductors L1a and L1b are connected in series between the terminal electrodes P1 and P2, and the inductors L2a and L2b are connected in series between the terminal electrodes P3 and P4. Further, the capacitor C5 is connected between the connection point between the inductors L1a and L1b and the common terminal electrode P0, and the capacitor C6 is connected between the connection point between the inductors L2a and L2b and the common terminal electrode P0. In actual use, the common terminal electrode P0 is connected to a ground potential. With this configuration, the inductors L1a, L1b and capacitor C5 constitute a first T-type LC filter, in which the terminal electrodes P1 and P2 are used as a signal input terminal and a signal output terminal, respectively. Further, the inductors L2a, L2b and capacitor C6 constitute a second T-type LC filter, in which the terminal electrodes P3 and P4 are used as a signal input terminal and a signal output terminal, respectively.

As exemplified in the present embodiment, the LC filter is not limited to the π-type, and may be the T-type. The T-type LC filter has an inductive impedance and is high in impedance in a high frequency band.

It is apparent that the present invention is not limited to the above embodiments, but may be modified and changed without departing from the scope and spirit of the invention.

For example, the LC filter according to the above embodiments has a configuration in which two π-type LC filters or two T-type LC filters are integrated on a single chip; however, the present invention is not limited to this, and it is sufficient for the LC filter according to the present invention to include at least one LC filter. Further, the circuit configuration need not be the π-type.

The shape of the inductor pattern is also not particularly limited and may be the spiral-shape as in the above embodiments, a helical shape wound over a plurality of conductive layers, or a meander shape. However, in order to obtain a large inductance, the inductor pattern preferably has a coil shape, i.e., a spiral or helical shape.

Further, in the above embodiments, the capacitive insulating films 11 to 16 provided in the capacitors C1 to C6, respectively, are each a single layer film; however, the capacitance of the capacitors C1 to C6 may be increased by alternately laminating a plurality of capacitive electrodes and a plurality of capacitive insulating films.

What is claimed is:

1. An LC filter comprising:
a conductive substrate;
a first capacitive insulating film having one surface covered with the conductive substrate and another surface covered with a first capacitive electrode;
a first inductor pattern having one end connected to the first capacitive electrode;
a first terminal electrode connected to another end of the first inductor pattern; and
a common terminal electrode connected to the conductive substrate;
a second terminal electrode connected to the first capacitive electrode and the one end of the first inductor pattern;
a second capacitive insulating film having one surface covered with the conductive substrate and another surface covered with a second capacitive electrode;
a third capacitive insulating film having one surface covered with the conductive substrate and another surface covered with a third capacitive electrode;
a fourth capacitive insulating film having one surface covered with the conductive substrate and another surface covered with a fourth capacitive electrode;
a second inductor pattern having one end connected to the third capacitive electrode and another end connected to the fourth capacitive electrode;
a third terminal electrode connected to the third capacitive electrode and the one end of the second inductor pattern; and
a fourth terminal electrode connected to the fourth capacitive electrode and the another end of the second inductor pattern,
wherein the first terminal electrode is connected to the second capacitive electrode, and
wherein a pattern shape of the first inductor pattern and that of the second inductor pattern are symmetric.

2. The LC filter as claimed in claim 1, wherein the conductive substrate includes one metal element selected from a group consisting of Ni, Cu, W, Pt, and Au.

3. The LC filter as claimed in claim 1, wherein the first inductor pattern includes a conductor pattern wound in a coil shape.

4. The LC filter as claimed in claim 1, wherein the common terminal electrode is supplied with a ground potential.

5. An LC filter comprising:
a conductive substrate having a first surface and a second surface opposite to the first surface;
a capacitive insulating film formed on the first surface of the conductive substrate;
a capacitive electrode formed on the capacitive insulating film;
a first insulating layer formed on the first surface of the conductive substrate so as to embed therein the capacitive electrode and the capacitive insulating film;
an inductor pattern formed on the first insulating layer;
a second insulating layer formed on the first insulating layer so as to embed therein the inductor pattern; and
a first terminal electrode and a common terminal electrode formed on the second insulating layer,
wherein the capacitive electrode is connected to one end of the inductor pattern,
wherein the first terminal electrode is connected to another end of the inductor pattern, and
wherein the common terminal electrode is connected to the conductive substrate.

6. The LC filter as claimed in claim 5, wherein the capacitive insulating film is partially formed on the first surface of the conductive substrate, thereby a part of the first surface of the conductive substrate is in contact with the first insulating layer without an intervention with the capacitive insulating film.

7. The LC filter as claimed in claim 5, wherein the second surface of the conductive substrate is exposed without being covered with an insulating material.

8. The LC filter as claimed in claim 5, wherein the conductive substrate comprises Ni.

* * * * *